United States Patent
Fuergut et al.

(10) Patent No.: US 7,524,699 B2
(45) Date of Patent: Apr. 28, 2009

(54) ELECTRONIC COMPONENT AND A PANEL

(75) Inventors: Edward Fuergut, Dasing (DE); Bernd Goller, Otterfing (DE); Robert-Christian Hagen, Sarching (DE); Simon Jerebic, Regensburg (DE); Jens Pohl, Bernhardswald (DE); Peter Strobel, Regensburg (DE); Holger Woerner, Regensburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/529,565

(22) PCT Filed: Jul. 8, 2004

(86) PCT No.: PCT/DE2004/001488

§ 371 (c)(1),
(2), (4) Date: Oct. 31, 2005

(87) PCT Pub. No.: WO2005/013364

PCT Pub. Date: Feb. 10, 2005

(65) Prior Publication Data

US 2006/0125042 A1    Jun. 15, 2006

(30) Foreign Application Priority Data

Jul. 28, 2003   (DE) ................................ 103 34 575

(51) Int. Cl.
*H01L 21/44* (2006.01)
*H01L 21/48* (2006.01)
*H01L 21/50* (2006.01)

(52) U.S. Cl. ........................ 438/108; 438/127; 257/686; 257/E23.048

(58) Field of Classification Search ................. 257/686, 257/E23.048; 438/126, 108, 127
See application file for complete search history.

(56) References Cited

U.S. PATENT DOCUMENTS

| | | | |
|---|---|---|---|
| 6,271,056 B1 | 8/2001 | Farnworth et al. | |
| 6,271,469 B1 * | 8/2001 | Ma et al. | 174/521 |
| 6,380,624 B1 | 4/2002 | Hung | |
| 6,404,043 B1 | 6/2002 | Isaak | |
| 6,418,615 B1 * | 7/2002 | Rokugawa et al. | 29/852 |
| 6,730,544 B1 * | 5/2004 | Yang | 438/110 |
| 6,737,750 B1 * | 5/2004 | Hoffman et al. | 257/777 |
| 2001/0054758 A1 | 12/2001 | Isaak | |

FOREIGN PATENT DOCUMENTS

| | | |
|---|---|---|
| EP | 0 559 366 | 12/1997 |
| JP | 62-119952 | 6/1987 |
| JP | 2001094045 | 4/2001 |

* cited by examiner

*Primary Examiner*—Howard Weiss
*Assistant Examiner*—John C Ingham
(74) *Attorney, Agent, or Firm*—Dicke, Billig, Czaja PLLC

(57) ABSTRACT

One embodiment of the invention relates to an electronic component having stacked semiconductor chips, and to a panel for production of the component. In one case, the stack has a flat conductor structure with a chip island on which a stacked semiconductor chip is arranged, while a first semiconductor chip is located underneath it. The chip island is surrounded by flat conductors which have contact pillars. These contact pillars have pillar contact pads which, together with the active upper face of the first semiconductor chip and the upper face areas of a plastic encapsulation compound form a coplanar overall upper face.

4 Claims, 4 Drawing Sheets

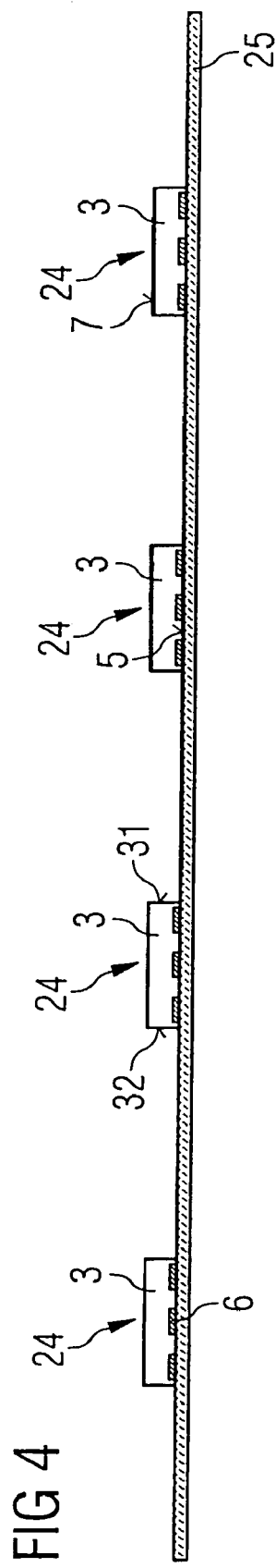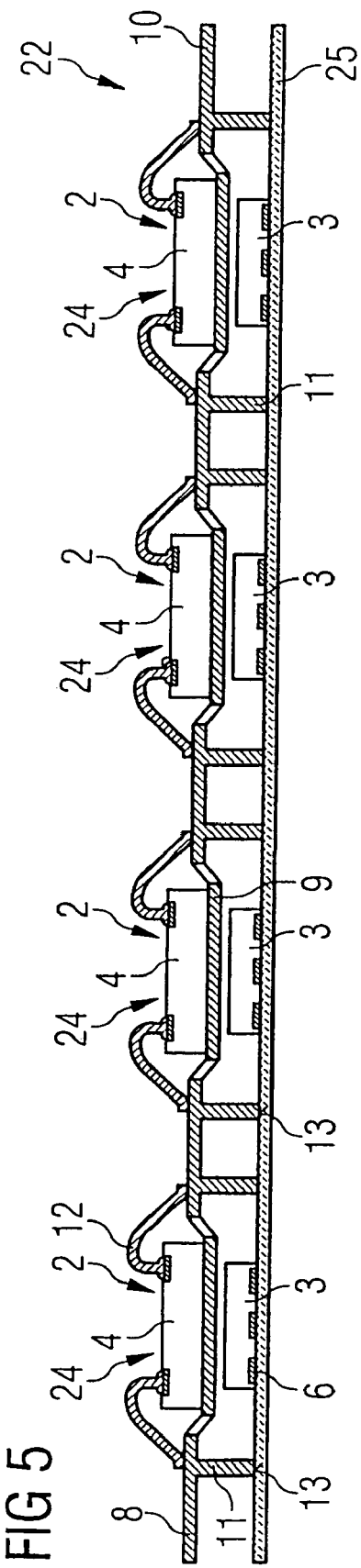

ELECTRONIC COMPONENT AND A PANEL

CROSS REFERENCE TO RELATED APPLICATION

This Utility Patent Application claims the benefit of the filing date of Application Number DE 103 34 575.2, filed Jul. 28, 2003, and International Application No. PCT/DE2004/001488, filed Jul. 8, 2004, all of which are herein incorporated by reference.

BACKGROUND

One embodiment of the invention relates to an electronic component having stacked semiconductor chips, and to a panel for production of the component.

The stacking of semiconductor chips of different size to form a compact electronic component is costly and is associated with high risks relating to correct interaction of the integrated circuits of the semiconductor chips. The high costs are incurred, in particular as a result of the provision of wiring layers or rewiring layers for each of the semiconductor chips to be stacked, and by the production of electrical connections between the wiring layers of each semiconductor chip. Furthermore, electrical connections must be created leading from the various wiring layers to outer contacts of an electronic component for surface mounting.

SUMMARY

One embodiment of the invention specifies an electronic component that can be produced at low cost, has stacked semiconductor chips and allows correct interaction of the stacked semiconductor chips and low-ost electrical connection of the contact pads of the semiconductor chips to outer contacts of the electronic component for surface mounting.

According to one embodiment of the invention, an electronic component is specified which has a stack of semiconductor chips. The stack includes at least one first semiconductor chip and a stacked second semiconductor chip. The semiconductor chips themselves include an active upper face with contact pads to their integrated circuits, and a rear face. Furthermore, a flat conductor structure with a chip island and flat conductors surrounding the chip island is arranged in the electronic component. Contact pillars on the flat conductors are aligned orthogonally with respect to the flat conductors.

The stacked second semiconductor chip is fixed by its rear face on the chip island of the flat conductor structure, and its contact pads are electrically connected via bonding wires to the flat conductors which surround the chip island. The first semiconductor chip is arranged underneath the chip island, and is surrounded by the contact pillars of the flat conductor structure. The flat conductor structure with the chip island and the stacked second semiconductor chip applied to it, as well as the bonding connections and the flat conductors which surround the chip island, as well as the outer surfaces of the contact pillars are embedded in a plastic encapsulation compound. The first semiconductor chip is likewise surrounded on its rear face and on its edge faces by the plastic encapsulation compound, and is arranged in the plastic encapsulation compound in such a way that its active upper face is aligned to be coplanar with respect to the upper face areas of the plastic encapsulation compound, and to be coplanar with respect to pillar surfaces of the contact pillars, with the upper faces which are aligned to be coplanar forming an overall upper face. In this context, the base surfaces of the contact pillars are referred to as pillar contact pads.

This overall upper face offers the capability to access the contact pads of the first semiconductor chip as well as the contact pads of the stacked second semiconductor chip via the contact pillars, the flat conductors and the bonding connections. Only one wiring layer is required on the overall upper face for this purpose, and electrically connects the semiconductor chips to one another via wiring lines.

One embodiment of the invention thus combines a specifically developed flat conductor structure which has metallic contact pillars, with a universal package structure to form an electronic component with stacked semiconductor chips. The pillar structures of the flat conductor structure allow through contacts to be produced. This results in pillar contact pads arranged flat on the overall upper face, and contact pads for the first semiconductor chip, which can then be electrically connected at low cost by means of microstructured wiring.

In this case, the mounting of the first semiconductor chip on a carrier with adhesive bonding on one side and the mounting of the stacked second semiconductor chip on the chip island of the flat conductor structure can be carried out very largely separately, thus minimizing the installation risk. Furthermore, the electronic component does not have an expensive multilayer substrate, but only a single wiring layer, which is arranged on the overall upper face. Semiconductor chips with a different design can thus be flexibly combined and stacked one on top of the other for the electronic component according to the invention, with identical semiconductor chips, or semiconductor chips of the same size, not being precluded.

The vertical through contacting through the plastic encapsulation compound to the overall upper face with the aid of the contact pillars of the flat conductor structure is produced at low cost. In this case, before application of the wiring layer, the pillar contact pads of the contact pillars remain, via which the contact pads of the stacked second semiconductor chip are connected, and the contact pads of the first semiconductor chip, which is arranged underneath the chip island, are visible so that wiring is made simpler by means of a wiring layer which is used by both stacked semiconductor chips.

In one embodiment, the wiring layer may have a wiring level which is arranged on the overall upper face and has outer contact pads. These outer contact pads are electrically connected via the wiring lines to pillar contact pads on the upper faces of the contact pillars, and/or to the contact pads of the first semiconductor chip. In this case, one wiring level is completely sufficient to provide electrical access to both semiconductor chips, for correct interaction of the stacked semiconductor chips.

In one embodiment, solder balls and/or stud bumps can be arranged as outer contacts on the outer contact pads. In this case, an application-specific form of outer contacts can be provided on the outer contact pads.

One embodiment of the invention relates to a panel which has a leadframe with component positions arranged in rows and columns. Electronic components which are already complete can be provided, with the stacked semiconductor chips, at the component positions on a panel such as this, and the outer contacts for each of the electronic components can also already be fitted on the panel. A panel such as this reduces the price of production of electronic components with stacked semiconductor chips according to one embodiment of the invention, thus allowing electronic components to be produced at low cost.

The shape of the panel may correspond, in its extent and extent markings, to a standard semiconductor wafer. In this case, method techniques that have been proven useful for semiconductor wafers can also be carried out successfully with a "wafer panel" such as this.

One embodiment of a method for production of a panel for two or more electronic components includes the following method steps. First, a leadframe is produced, with component positions arranged in rows and columns. In this case, a component position includes a chip island and flat conductors surrounding the chip island. Contact pillars are arranged on the flat conductors and are aligned orthogonally with respect to the flat conductors. A leadframe such as this with chip islands, flat conductors and contact pillars arranged on them can be produced by structure etching of a metal plate composed of a copper alloy or of a bronze alloy, or by stamping a metal foil, at low cost.

Once a leadframe such as this is available, a semiconductor chip to be stacked is fitted at the component positions on the chip islands. Bond connections are then produced between flat conductors which surround the chip island and the contact pads on active upper faces of the stacked semiconductor chips. A bonding wire technique which makes use of bonding wires composed of a gold or an aluminum alloy is suitable for production of such bond connections.

Irrespective of the time at which the leadframe is fitted with stacked second semiconductor chips, first semiconductor chips can be fitted with their active upper faces to a carrier with adhesive bonding on one side. For this purpose, the semiconductor chips are arranged in rows and columns which correspond to the rows and columns of the component positions on the leadframe. The leadframe with the stacked second semiconductor chip is then applied and aligned to the carrier, with adhesive bonding on one side, with semiconductor chips arranged in rows and columns, in such a way that the first semiconductor chips are arranged underneath the chip islands, and are surrounded by contact pillars.

The base surfaces or pillar contact pads of these contact pillars are positioned on the carrier, with adhesive bonding on one side, and are thus aligned in a coplanar form on a common plane with the active upper faces and the contact pads of the first semiconductor chip.

Next, the leadframe with stacked semiconductor chips and bond connections is then embedded in a plastic encapsulation compound to form a composite panel on the carrier. Once the plastic encapsulation compound has cured, the composite panel is self-supporting and the carrier can be removed exposing an overall upper face composed of active upper faces of the first semiconductor chips, pillar contact pads of the plastic pillars, and an upper face of the plastic compound. A wiring layer is then applied to the overall upper face, forming wiring lines and outer contact pads on the composite body. During this process, the wiring lines connect the outer contact pads to the contact pads of the first semiconductor chip and/or to the pillar contact pads of the contact pillars.

One embodiment of this method results in a panel with two or more components by means of a single molding process, and only a single wiring layer is required in order to connect the stacked semiconductor chips and their integrated circuits to one another, and to connect them to outer contact pads. Outer contacts can then be applied to the outer contact pads without having to separate the panel into individual components at this stage. The panel then just needs to be separated in order to produce individual electronic components, which can be done by sawing along the saw tracks between the component positions, which are arranged in rows and columns.

It is also possible to provide the outer contact pads on an electronic component with outer contacts only after the panel has been separated into individual electronic components. This may be used in many cases when different forms of outer contacts are required for different applications.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 4 illustrates a schematic cross section through a carrier with adhesive bonding on one side and with first semiconductor chips.

FIG. 5 illustrates a schematic cross section through the leadframe illustrated in FIG. 3, which has been fitted on the carrier, with adhesive bonding on one side, as illustrated in FIG. 4.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
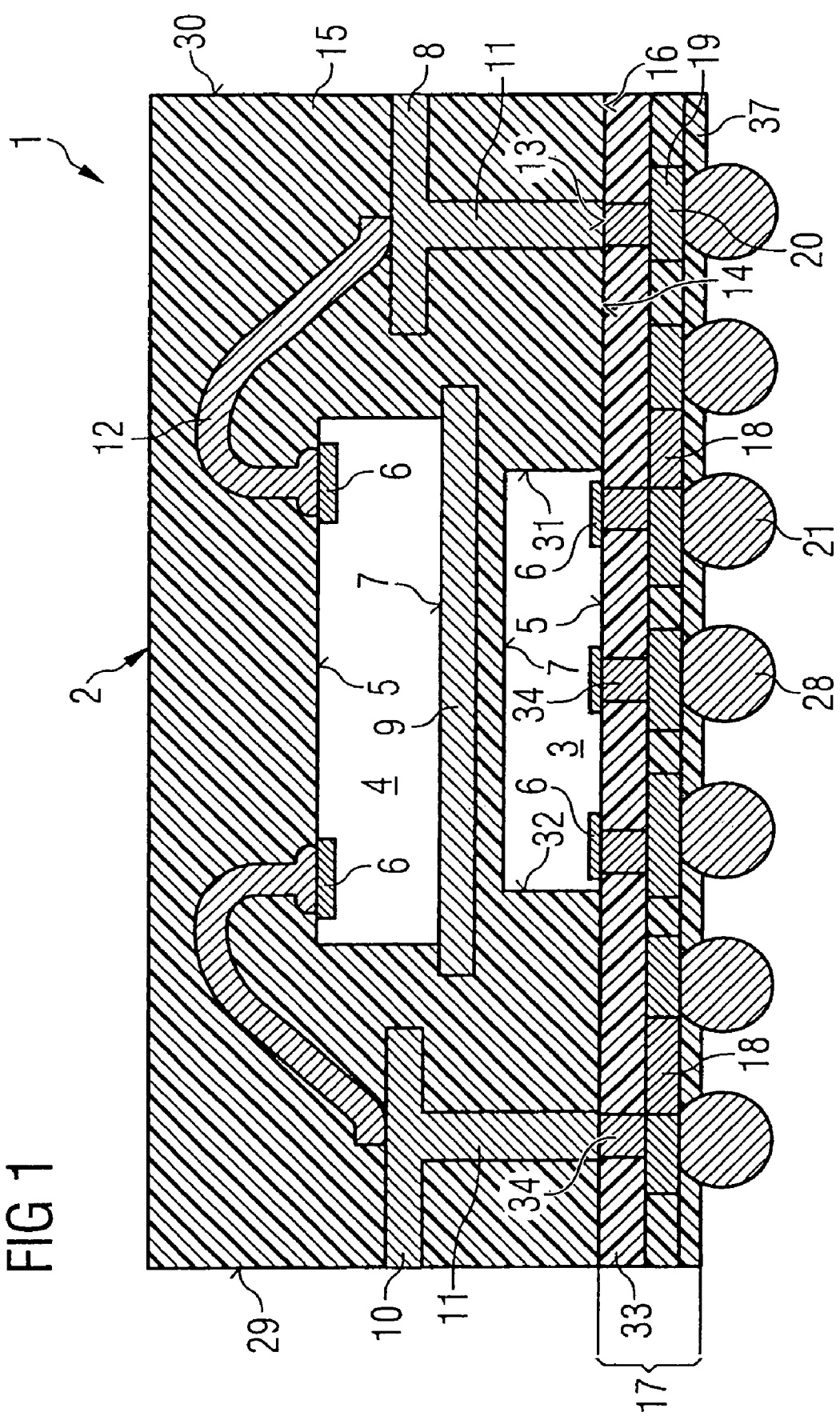
FIG. 1 illustrates a schematic cross section through an electronic component, according to one embodiment of the invention.

FIG. 1 illustrates a schematic cross section through an electronic component 1, according to one embodiment of the invention. The electronic component 1 has a stack 2 including a first semiconductor chip 3 and a stacked second semiconductor chip 4. The semiconductor chips 3 and 4 have active upper faces 5 with contact pads 6. A rear face 7 of the stacked second semiconductor chip 4 is arranged on a chip island 9. The chip island 9 is part of a flat conductor structure 8 which surrounds the chip island 9 with flat conductors 10. Bond connections 12 extend from the contact pads 6 of the stacked second semiconductor chip 4 to the flat conductors 10. The flat conductors 10 extend as far as the edge faces 29 and 30 of the electronic component 1.

The flat conductors 10 have contact pillars 11, which are arranged orthogonally with respect to the flat conductors 10. The contact pillars 11 extend as far as an overall upper face 16, which is formed from the active upper face 5 of the first semiconductor chip 3, pillar contact pads 13 of the contact pillars 11, and an upper face area 14 of a plastic encapsulation compound 15. The flat conductor structure 8, the bond connections 12 and the stacked second semiconductor chip 4 are embedded in the plastic encapsulation compound. The first semiconductor chip 3 is arranged underneath the chip island 9, in such a way that its active upper face 5 together with the contact pads 6 forms an overall upper face with the pillar contact pads 13 of the contact pillars 11 and with upper face areas of the plastic encapsulation compound 15.

The plastic encapsulation compound 15 embeds the flat conductor structure 8, the bond connections 12, the stacked second semiconductor chip 4, as well as the rear face 7 of the first semiconductor chip 3 and the edge faces 31 and 32 of the first semiconductor chip. A three-level wiring layer 17 is arranged on the overall upper face 16. An insulation layer 33 with through contacts 34 is arranged directly on the overall upper face. The through contacts 34 are electrically connected to the contact pads 6 of the first semiconductor chip 3 and to the pillar contact pads 13 of the contact pillars 11. As the next level, the wiring layer 17 has a wiring level 19, which is in the form of a structured metal layer, and has wiring lines 18 as well as outer contact surfaces 20. The wiring lines 18 connect the outer contact pads 20 to one another and, via the through contacts 34, to the contact pads 6 of the first semiconductor chip 3 and to the pillar contact pads 13 of the contact pillars 11, which are themselves electrically connected via the flat conductors 10 and via the bonding wires 12 to the contact pads 6 of the stacked second semiconductor chip 4. As a third level, a solder resist layer 37 is arranged on the wiring level 19, protects the wiring lines 18 and leaves only the outer contact pads 20 free. Solder balls 21 are arranged on the outer contact pads 20, as outer contacts 28 for the electronic component 1.

An electronic component such as this can be produced at low cost from one panel in a small number of method steps that will be explained with reference to FIGS. 2 to 7, which illustrate intermediate products of individual method steps.

Figure 2:
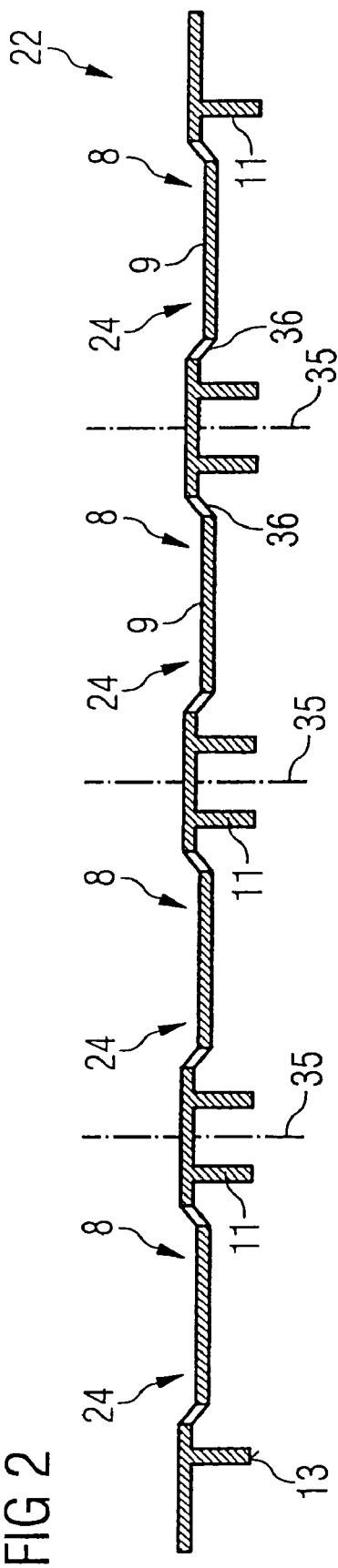
FIG. 2 illustrates a schematic cross section through a leadframe with four component positions for production of components as illustrated in FIG. 1.

FIG. 2 illustrates a schematic cross section through a leadframe 22 with four component positions 24 for production of components as illustrated in FIG. 1. Sawing along the dashed-dotted line 35 results in the flat conductor structure 8, which is illustrated in FIG. 1 and is embedded in the plastic compound. The component positions 24 are arranged in rows and columns, so that a leadframe such as this provides two or more flat conductor structures 8.

A component position 24 in the leadframe 22 has a chip island 9 which is surrounded by flat conductors 10, with the chip island 9 being held in position by means of flat conductor webs 36. Contact pillars 11 are integrally connected to the flat conductors 10, are aligned orthogonally with respect to the flat conductors 10, and have a pillar contact pad 13. In one embodiment, the length of these contact pillars 11 is between 0.1 and 0.9 mm. The contact pillars 11 ensure that there is sufficient height underneath the chip island 9 to arrange a first semiconductor chip there.

Figure 3:
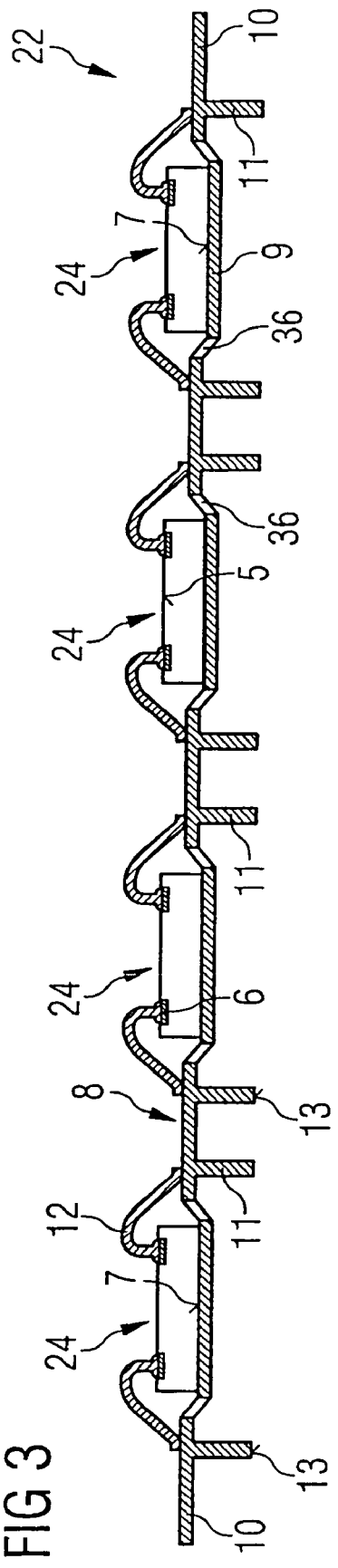
FIG. 3 illustrates a schematic cross section through the leadframe as illustrated in FIG. 2, fitted with a second stacked semiconductor chip in the component positions.

FIG. 3 illustrates a schematic cross section through the leadframe 22 as illustrated in FIG. 2, fitted with second stacked semiconductor chips 4, in the component positions 24. The semiconductor chips 4 are fixed by their rear faces 7 on the chip islands 9 by means of a conductive adhesive or by means of a eutectic solder. The contact pads 6 on the active upper face 5 of the stacked second semiconductor chip 4 are connected via gold-alloy bonding wires 12 to the flat conductors 10. For this purpose, the flat conductors 10 have a coating, which can be bonded, on the bonding surfaces and/or on the touching surfaces of the bonding wire connections 12. The pillar contact pads 13 of the contact pillars 11 are thus electrically connected via the flat conductors 10 and the bonding wire connections 12 to the contact pads 6 of the integrated circuit of the stacked second semiconductor chip 4.

While the leadframe 22 is fitted with the second semiconductor chip 4 and is connected by means of bonding wire connections 12, first semiconductor chips are arranged on a carrier, with adhesive bonding on one side and is illustrated in FIG. 4. First semiconductor chips 3 are arranged on a carrier 25, as is illustrated in FIG. 4, irrespective of the time of production and fitting of the leadframe 22.

FIG. 4 illustrates a schematic cross section through a carrier 25 with adhesive bonding on one side and with first semiconductor chips 3. For this purpose, the active upper faces 5 of the first semiconductor chips 3 are adhesively bonded by their contact pads 6 to the adhesive face of the carrier 25. The rear faces 7 of the semiconductor chips 3 as well as the edge faces 31 and 32 of the first semiconductor chips 3 are freely accessible. The first semiconductor chips 3 are arranged on the carrier 25 in rows and columns corresponding to the rows and columns of the component positions 24 on the leadframe, as is illustrated in FIGS. 2 and 3.

FIG. 5 illustrated a schematic cross section through the leadframe 22 illustrated in FIG. 3, which is fixed by its pillar contact pads 13 on the carrier 25, with adhesive bonding on one side, as illustrated in FIG. 4. For this purpose, the pillar contact pads 13 of the contact pillars 11 are adhesively bonded to the adhesive face of the carrier 25 in such a way that the contact pillars 11 surround the first semiconductor chip 3 on the carrier 25, and the chip island 9 is aligned with the stacked second semiconductor chip 4 above the first semiconductor chip 3. The length of the contact pillar 11 in this case depends on the thickness of the first semiconductor chip 3 which, in this embodiment of the invention, is 100 µm, since the first semiconductor chip 3 is a thinly ground semiconductor chip. However, thicker semiconductor chips may also be used, since the length of the contact pillars 11 may be varied between 0.1 and 0.9 mm for a leadframe that has been structured by etching.

Figure 6:
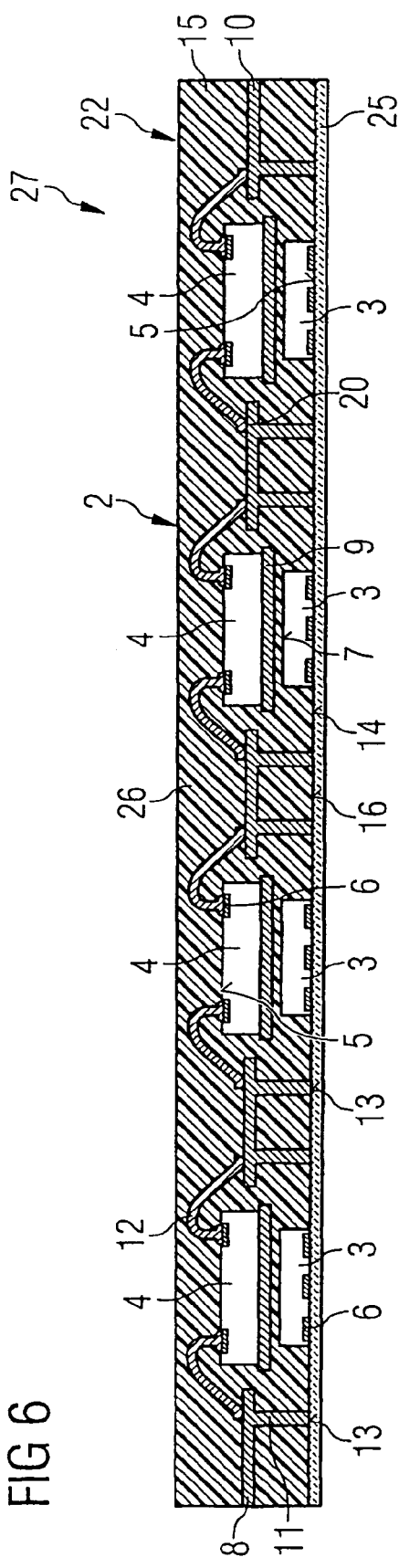
FIG. 6 illustrates a schematic cross section through a composite body formed from a plastic encapsulation compound with an embedded leadframe, as well as first and second semiconductor chips.

FIG. 6 illustrates a schematic cross section through a composite body 27 formed from a plastic compound 26 with an embedded leadframe 22, as well as embedded first and second semiconductor chips 3 and 4. Only one molding process on the carrier 25 is required to embed the structure as illustrated in FIG. 5 in a plastic compound 26. Once the plastic compound 26 has cured, the carrier 25 is removed, and the overall upper face 16 of the self-supporting composite body 27 is exposed. The delamination of the carrier 25 from the composite body 27 can be achieved by heating the adhesive layer between the carrier and the overall upper face 16, assuming that a thermoplastic is used as the adhesive. The carrier 25 is in this case removed by pulling the carrier off the composite body 27 at the side, when a rigid carrier 25, with adhesive bonding on one side, is used. The carrier 25 can be rolled off when a film is used as the carrier with adhesive bonding on one side. A wiring layer is applied to the overall upper face 16, which has now been exposed, in order to connect the first semiconductor chip 3 to the stacked second semiconductor chip 4.

Figure 7:
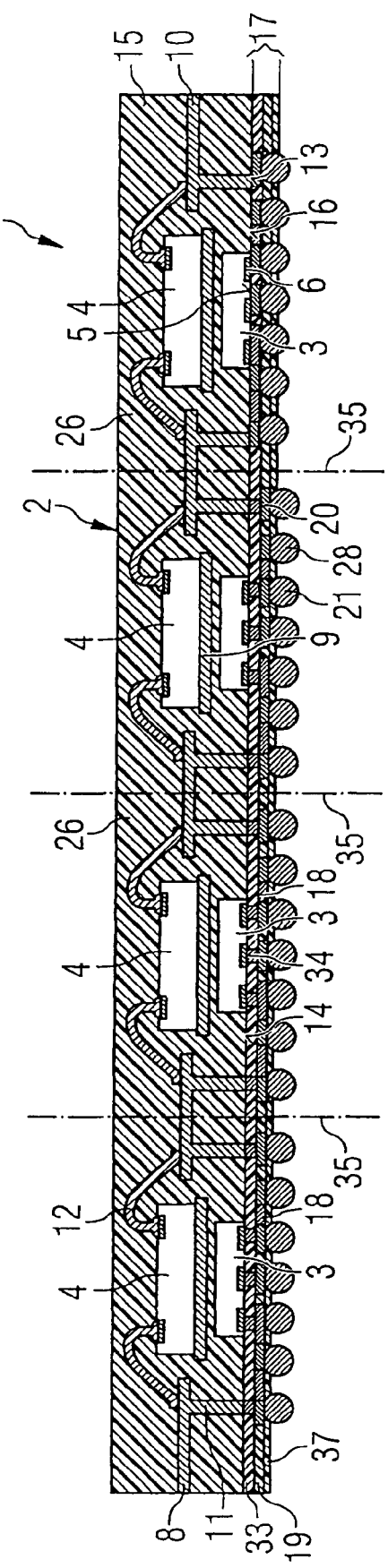
FIG. 7 illustrates a schematic cross section corresponding to FIG. 6 with a wiring layer fitted and outer contacts applied, on an overall upper face of the panel.

FIG. 7 illustrated a schematic cross section corresponding to FIG. 6 with a wiring layer 17 fitted and outer contacts 28 applied on an overall upper face 16 of the panel 23. The fitting of the wiring layer 17, which itself has three levels, is carried out successively by fitting and structuring of the three levels. For this purpose, a first insulation layer 33 has through contacts 34, which are connected to the pillar contact pads 13 of the contact pillars 11, and to the contact pads 6 of the first semiconductor chip 3. As a further level, a structured metal layer is arranged as a wiring level 19 in the wiring layer 17. This wiring level 17 has wiring lines 18 between outer contact pads 20 and through contacts 34.

A solder resist layer 37 is applied as a third level of the wiring layer 17, leaving only the outer contact pads of the wiring level 19 free. In this embodiment of the invention, solder balls are applied as outer contacts 28 to the exposed outer contact pads 20.

A panel 23 formed in this way with component positions 24 has a stack 2 including a first and a second semiconductor chip 3 and 4 at the component positions 24, and can be separated along the dashed-dotted line 35, once the outer contacts 28 have been fitted, in order to form individual components.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A method for production of a panel for a plurality of electronic components comprising:

producing a leadframe with component positions arranged in rows and columns, whereby each component position comprises a chip island and flat conductors which surround the chip island, as well as contact pillars, which are arranged on the flat conductors and are aligned orthogonally with respect to the flat conductors, and wherein the flat conductors extend between neighboring chip islands;

applying a plurality stacked semiconductor chips to the chip islands of the component positions;

producing bonding wire connections between the flat conductors and contact pads on active first faces of the stacked semiconductor chips;

applying first semiconductor chips with their active first faces to a carrier with adhesive bonding on one side, with the first semiconductor chips being arranged in rows and columns which correspond to the rows and columns of the component positions;

applying the leadframe with a plurality of stacked semiconductor chips to the carrier in such a way that the contact pillars of the leadframe are adhesively bonded by their first faces to the carrier and the first semiconductor chips are arranged on the carrier underneath the chip islands of the leadframe and are surrounded by contact pillars;

embedding the leadframe with stacked semiconductor chips and bonding wire connections in a plastic compound to form a composite body on the carrier;

removing the carrier exposing an overall first face composed of active first faces of the first semiconductor chips, pillar contact pads of the contact pillars, and an first face of the plastic compound;

applying a wiring layer to the overall first face, forming wiring lines and outer contact pads; and wherein the wiring lines connect the outer contact pads to the contact pads of the first semiconductor chip, and/or to the pillar contact pads of the contact pillars.

2. The method of claim 1, further comprising applying solder balls to the outer contact pads to provide outer contacts.

3. The method of claim 1, further comprising separating the panel into individual electronic components.

4. The method of claim 3, further comprising applying outer contact pads of an electronic component.

* * * * *